United States Patent
Wu

(10) Patent No.: US 7,193,303 B2
(45) Date of Patent: Mar. 20, 2007

(54) SUPPORTING FRAME FOR SURFACE-MOUNT DIODE PACKAGE

(76) Inventor: Jiahn-Chang Wu, 15, Lane 13, Alley 439, Her-Chiang Street, Chu-Tung, Hsinchu (TW)

( * ) Notice: Subject to any disclaimer, the term of this patent is extended or adjusted under 35 U.S.C. 154(b) by 0 days.

(21) Appl. No.: 11/199,925

(22) Filed: Aug. 10, 2005

(65) Prior Publication Data

US 2005/0269679 A1    Dec. 8, 2005

Related U.S. Application Data

(60) Division of application No. 10/308,274, filed on Dec. 3, 2002, now Pat. No. 7,095,101, which is a continuation of application No. 09/712,664, filed on Nov. 15, 2000, now abandoned.

(51) Int. Cl.
  *H01L 23/02* (2006.01)
  *H01L 33/00* (2006.01)

(52) U.S. Cl. ............... 257/678; 257/E23.037; 257/E23.039; 257/E23.048; 257/E33.057; 257/E33.059; 257/E33.066; 257/431; 257/432; 257/433; 257/434; 257/99; 257/730; 257/100; 257/116; 257/796; 257/680; 257/673

(58) Field of Classification Search ........ 257/E33.057, 257/E33.066, E23.037, E23.039, E23.048, 257/431–434, 184, 99, 730, 100, 116, 273, 257/673, 668, 678, 796, 684, 666, 680
See application file for complete search history.

(56) References Cited

U.S. PATENT DOCUMENTS

| | | | | |
|---|---|---|---|---|
| 5,060,117 A | * | 10/1991 | Dorlanne et al. | 361/813 |
| 5,398,166 A | * | 3/1995 | Yonezawa et al. | 361/784 |
| 5,673,730 A | * | 10/1997 | Hamilton | 140/105 |
| 6,274,924 B1 | * | 8/2001 | Carey et al. | 257/676 |
| 6,414,415 B1 | * | 7/2002 | Shibutani et al. | 310/313 R |
| 6,614,103 B1 | * | 9/2003 | Durocher et al. | 257/678 |
| 2002/0076849 A1 | * | 6/2002 | Wang et al. | 438/65 |
| 2003/0116838 A1 | * | 6/2003 | Wu | 257/678 |
| 2003/0201542 A1 | * | 10/2003 | Wu | 257/773 |

* cited by examiner

*Primary Examiner*—Alexander Oscar Williams
(74) *Attorney, Agent, or Firm*—H. C. Lin, Patent Agent

(57) ABSTRACT

A supporting frame is used to solidly bridge to the two metallic contacts of a surface mount diode chip. Any bending or twisting stress between the two contacts is borne by the supporting frame instead of the diode chip. Otherwise the stress may damage the diode chip. wherein said supporting forms a cantilever over said first metallic contact and the overhanging end of the cantilever is glued to said second metallic contact.

4 Claims, 14 Drawing Sheets

35

SUPPORTING FRAME FOR SURFACE-MOUNT DIODE PACKAGE

This application is a division of patent application Ser. No. 10/308,274, filed Dec. 3, 2002 now U.S. Pat. No. 7,095,101, which is a continuation of application Ser. No. 09/712,664, filed Nov. 15, 2000, now abandoned.

BACKGROUND OF THE INVENTION (1) Field of the Invention

This invention relates to semiconductor device package, particularly a surface-mount diode package.

(2) Brief Description of the Related Art

FIG. 1 shows a prior art diode package. A semiconductor diode chip 10 has two bottom electrodes 101 and 102 at two ends of the chip as shown in FIG. 2, which is section view of FIG. 1 along the dotted section line. The electrodes 101 and 102 are attached respectively to two metallic contacts 11 and 12 by means of solder 14. These two metallic base contacts serve as leads for surface mounting of the diode package on a mother board The chip 10 is then covered and sealed in a glue 13.

Since the chip is supported on the two metallic base plates 11 and 12, any relative bending and twisting of the two metallic contacts may cause damage to the chip 10.

SUMMARY OF THE INVENTION

An object of this invention is to strengthen the support of a diode chip in a surface-mount package. Another object of this invention is to improve the reliability of a diode package.

These objects are achieved by adding a supporting frame bridging the two metallic contacts. Thus any bending or twisting stress exerted between the two contacts is mainly borne by the supporting frame instead of the chip, and the supporting frame is strong enough to withstand any such bending and/or twisting stress.

DETAILED DEACRIPTION OF THE INVENTION

Figure 1:
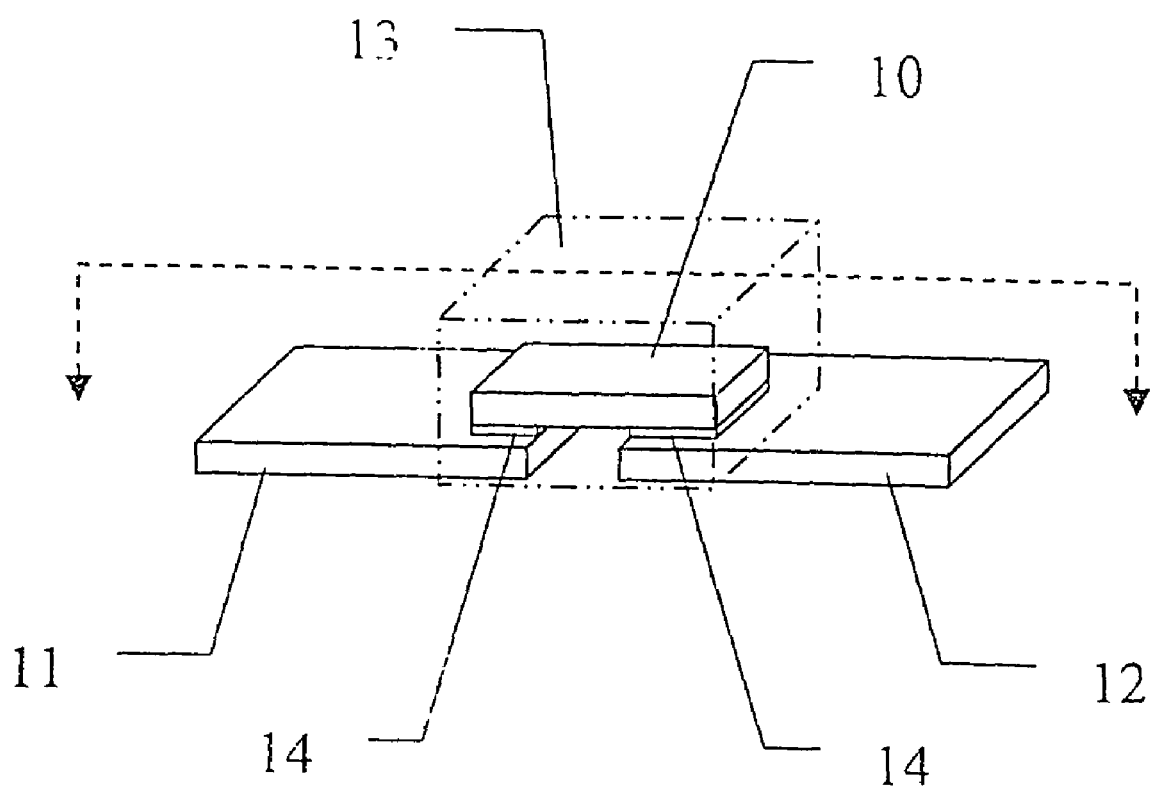
FIG. 1 shows a prior art diode package.
Figure 2:
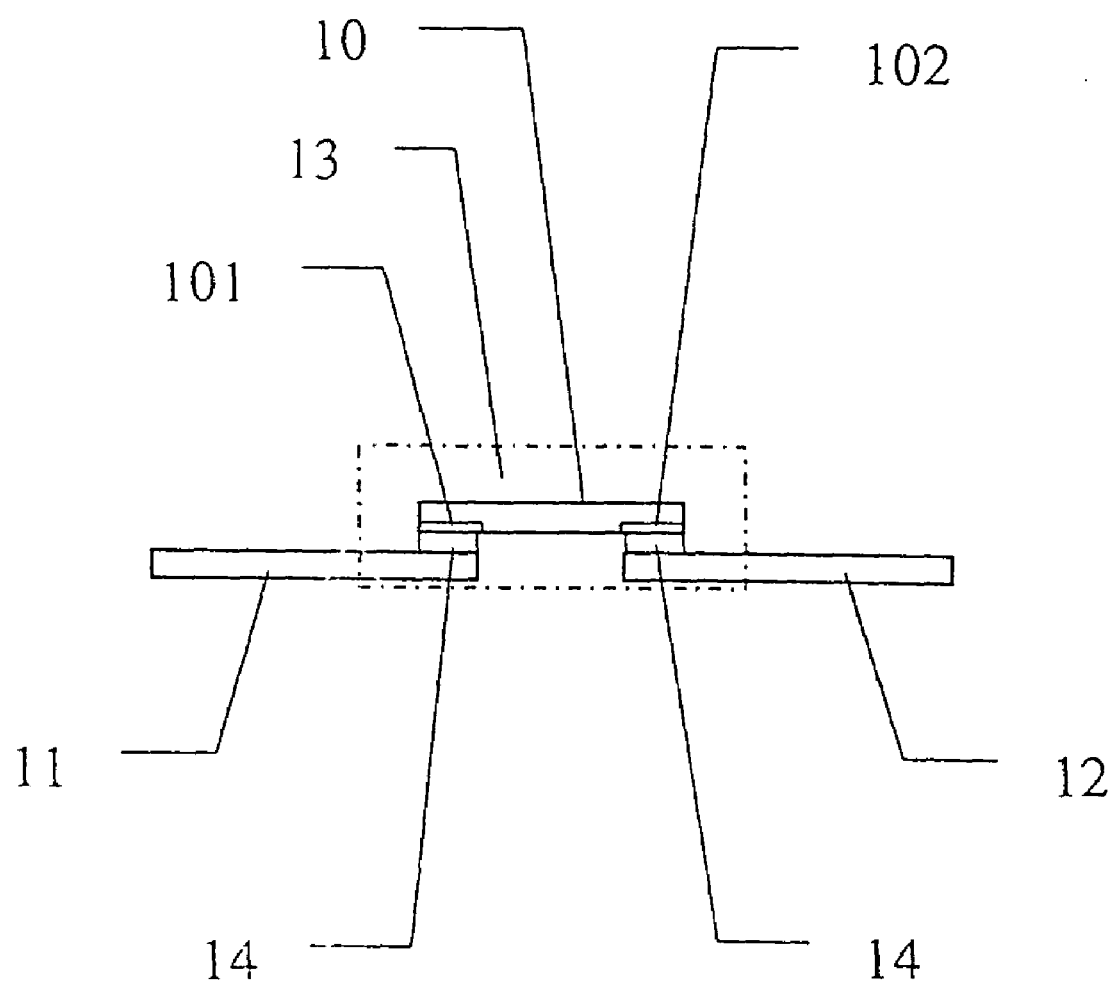
FIG. 2 shows a cross section view of FIG. 1
Figure 3:
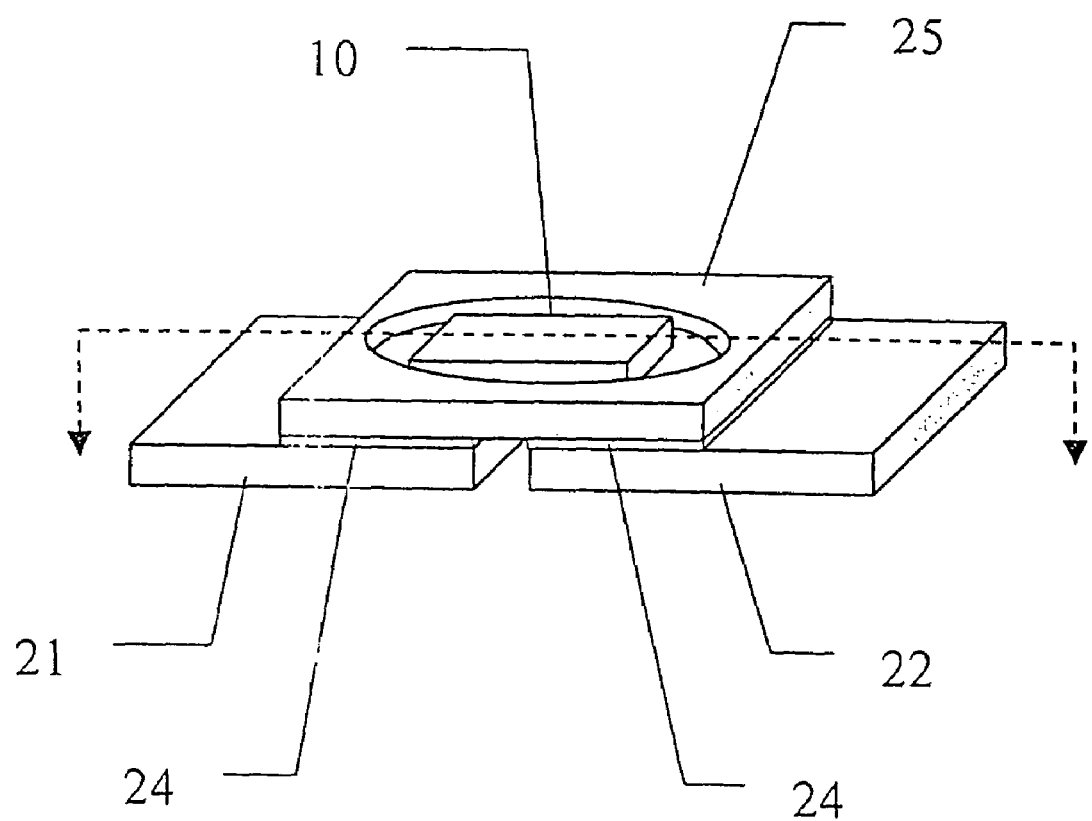
FIG. 3 shows the base structure of the present invention with a supporting frame around the diode chip.

FIG. 3 shows the basic structure of the present invention. A diode chip 10 is mounted over two metallic contacts 21, 22, serving as leads of a surface mounting diode package. The diode chip 10 is surrounded by a metal frame 25, which is also mounted over the two metallic contacts 21, 22 by solders 24.

Figure 4:
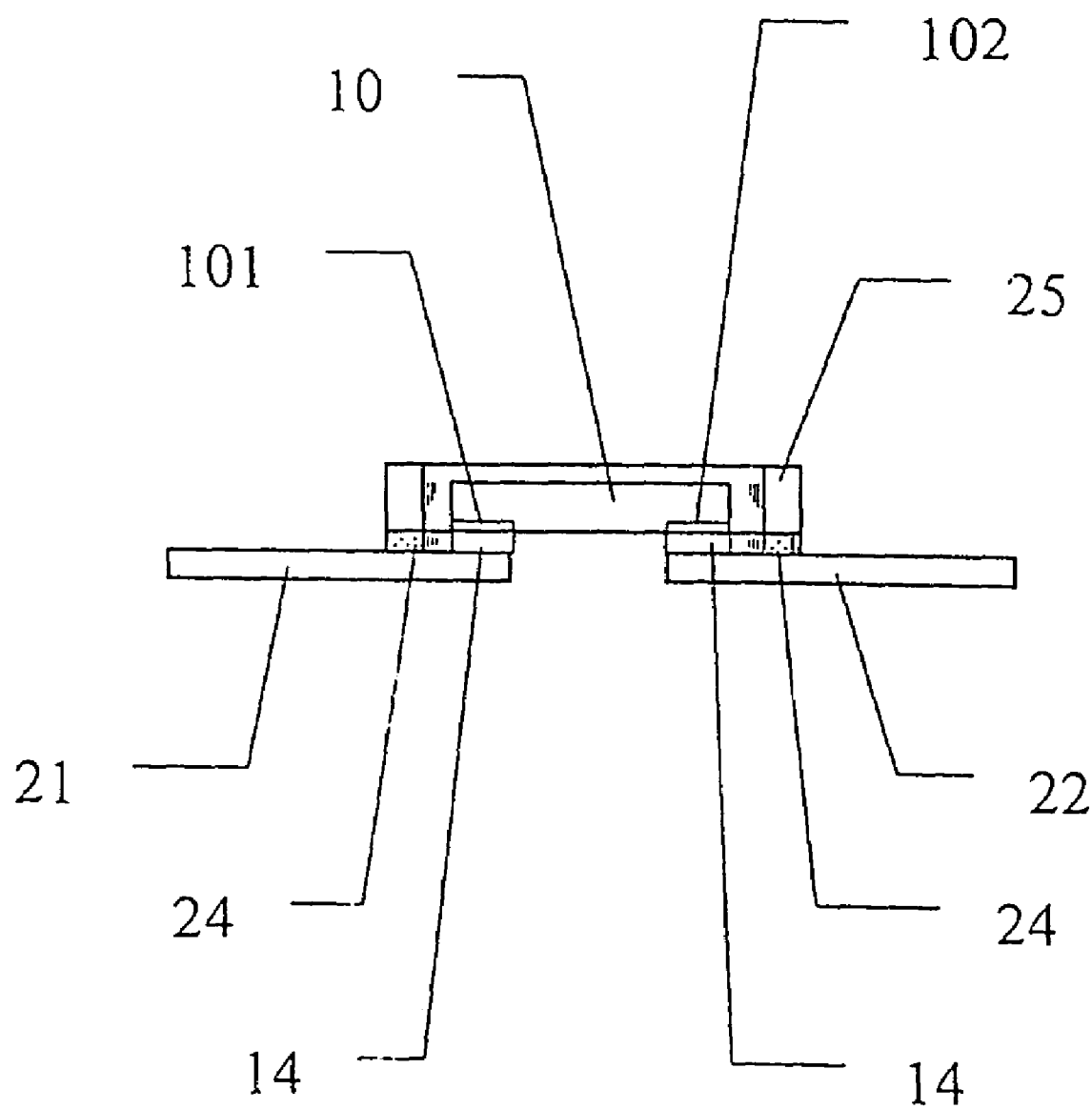
FIG. 4 shows the cross section view of the FIG. 3.

FIG. 4 shows the cross section view of FIG. 3 along the dotted section line The diode chip has two bottom electrodes 101 and 102, which are connected to the metallic contacts 21 and 22, respectively by means of the solder 14. The supporting frame 25 is also mounted over the two supporting metallic frame 25 by means of solders 24. Because the supporting frame 25 is larger than the diode chip 10 and surrounds the diode chip, any bending or twisting stress exerted between the two metallic contacts 21, 22 is withstood by the supporting frame 25 instead of the diode chip. Thus, the diode chip is protected by the supporting frame 25.

Figure 5:
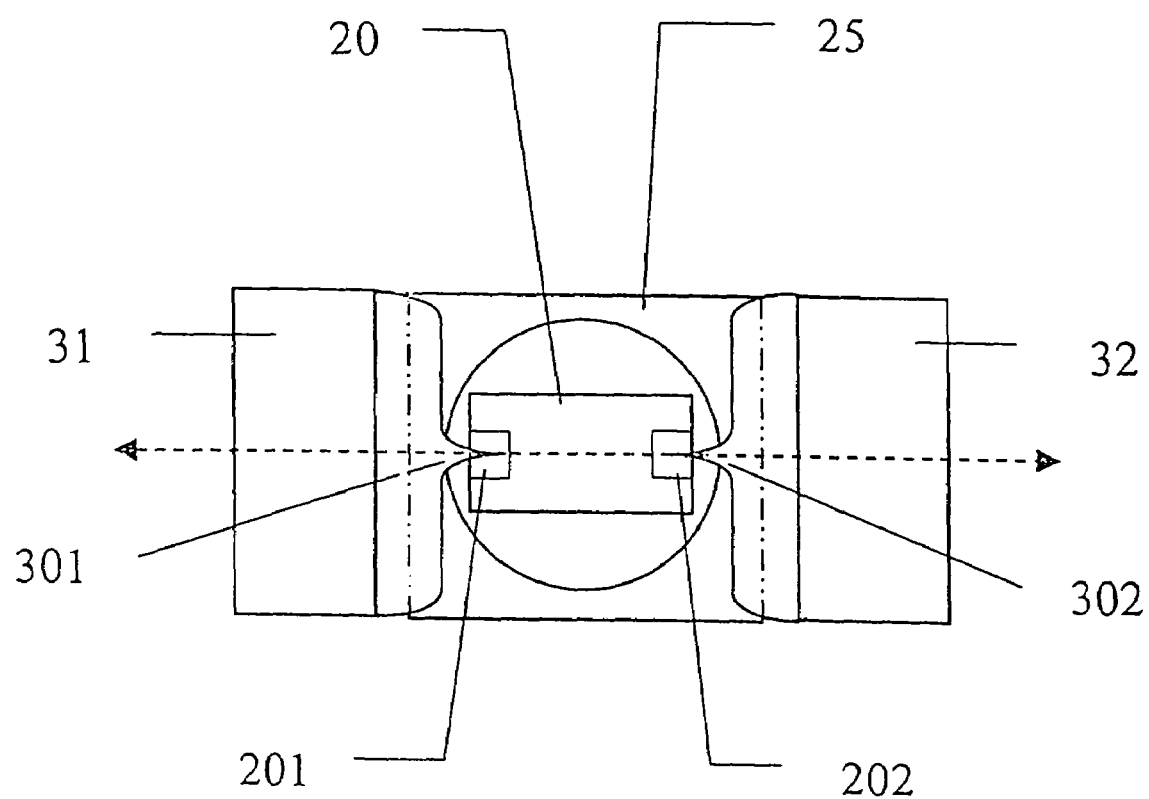
FIG. 5 shows a second embodiment of the present invention.
Figure 6:
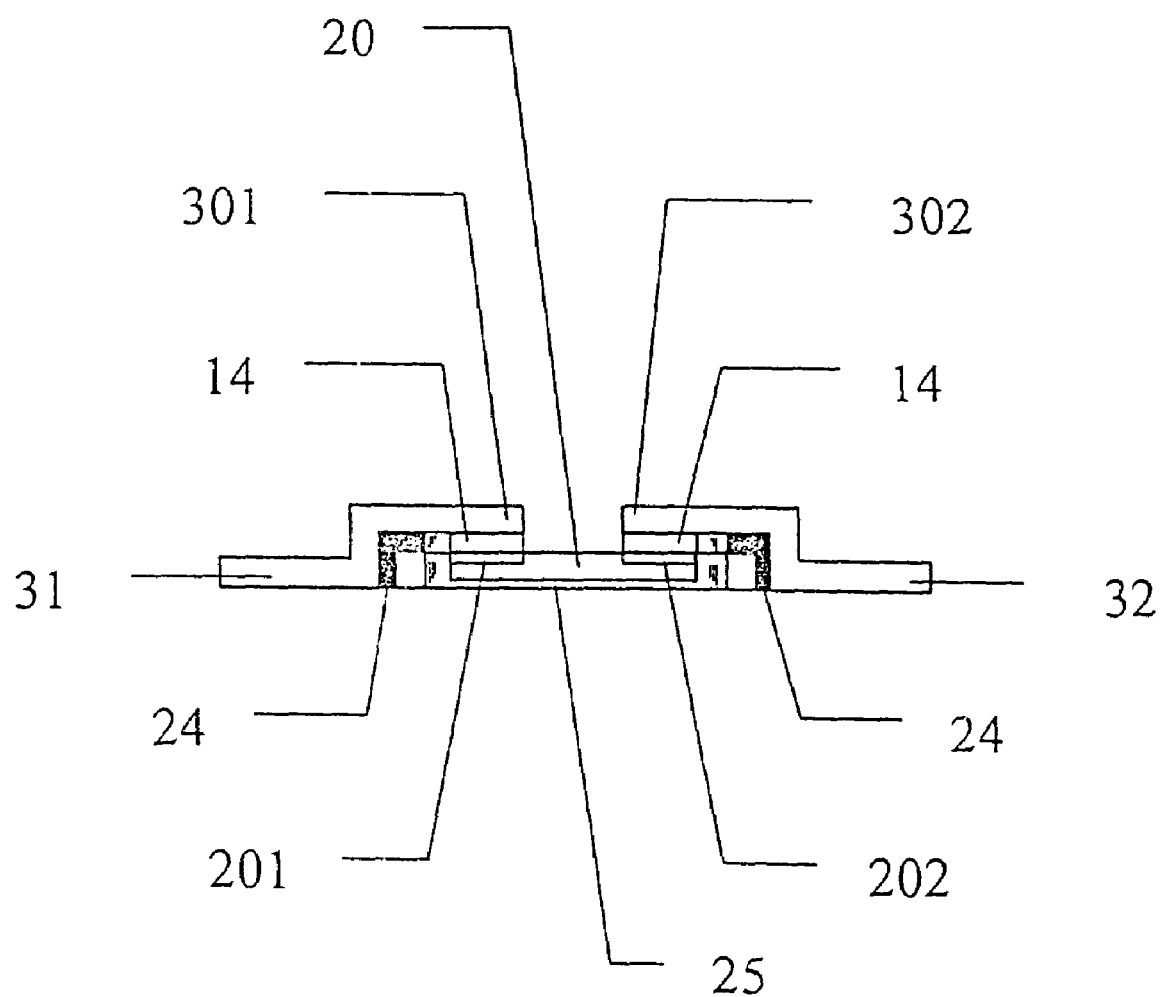
FIG. 6 shows the cross section view of FIG. 5.

FIG. 5 shows a second embodiment of the present invention. The diode chip 20 has two top electrodes 201, 202. The diode chip 20 is surrounded by a supporting frame 25 which is attached to two metal contacts 31 and 32, serving as leads for surface mounted to a mother board. The electrodes 201 and 202 are connected to the two metal contacts 31 and 32 respectively by means by solders 14 as shown in FIG. 6 at points 301 and 302, which is a cross section view of FIG. 5 along the dotted section line. The supporting frame 25 cups the diode chip 20 and is hanging under the two zigzag metallic contacts 31, 32 by means of solders 24. Since the supporting frame 25 bridges between the two metallic contacts 31, 32, the supporting frame 25 prevents any bending or twisting between the two metallic contacts 31, 32. As the diode chip 20 is soldered under the zigzag metallic contacts 31, 32, the supporting frame 25 prevents any bending or twisting stress exerted to the diode.

Figure 7:
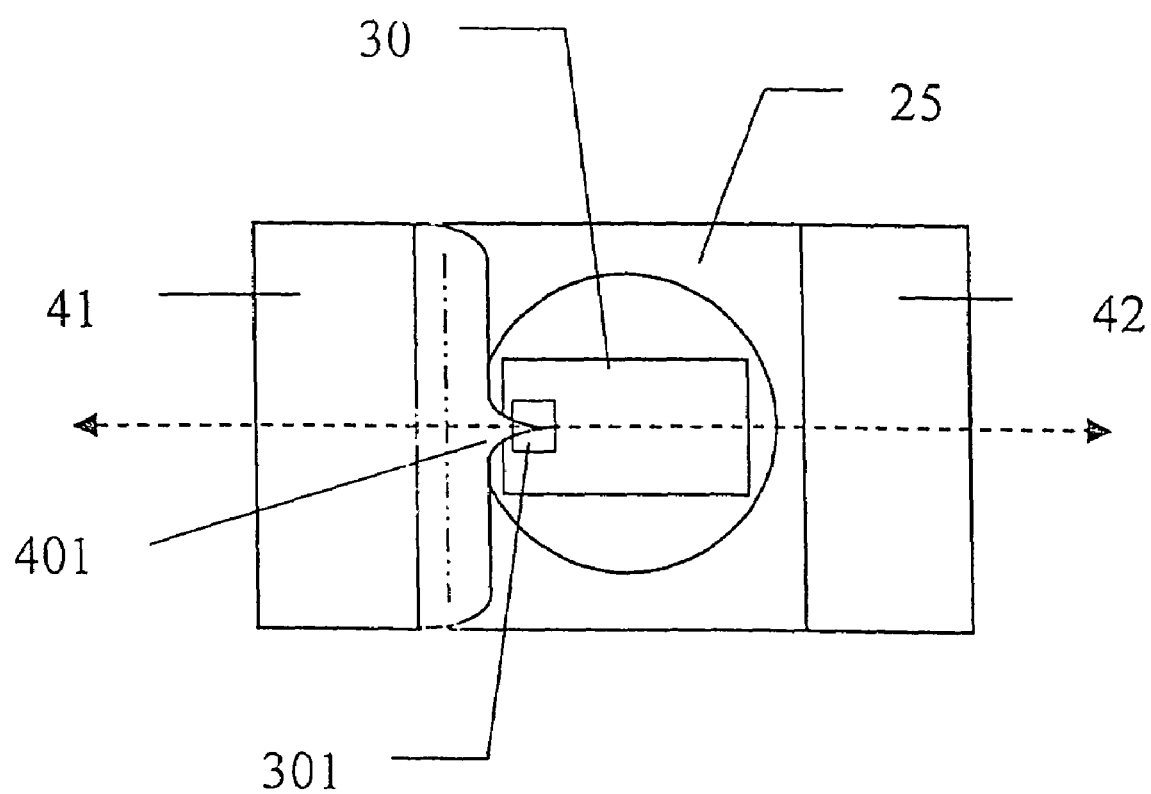
FIG. 7 shows a third embodiment of the present invention.
Figure 8:
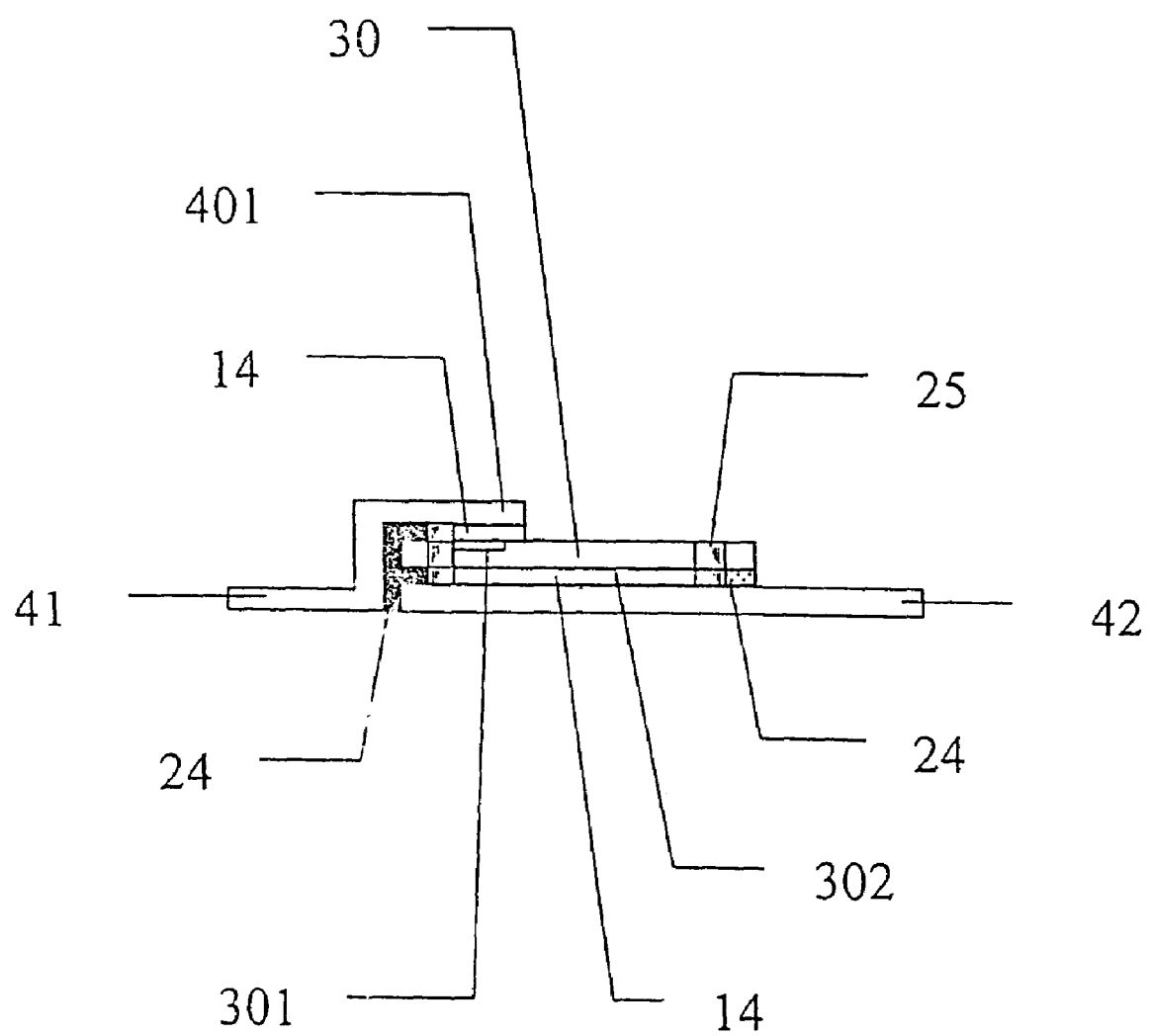
FIG. 8 shows the cross section view of FIG. 7.

FIG. 7 shows a third embodiment of the present invention for packaging a diode chip 30 with a single top electrode 301 and a bottom electrode. The diode chip 30 is surrounded by a supporting frame 25. The top electrode 301 is connected to a metallic contact 41 through a lead 401 for surface mounting. The bottom electrode of the diode chip is connected to another metallic contact 42 for surface mounting. FIG. 8 shows the cross section view FIG. 7 along the dotted line. The top electrode 301 of the diode chip 30 is connected to the lead 401 of a zigzag metallic plate 41 by means of the solder 14. The bottom electrode 302 of the diode chip 30 is connected to the metallic contact 42 by means of the glue 24, which is between the metallic contact 41 and the supporting frame 25. The supporting frame 25 is also mounted over the metallic contact 42 by means of glue 24. The supporting frame 25 prevents bending or twisting stress exerted to the diode.

Figure 9:
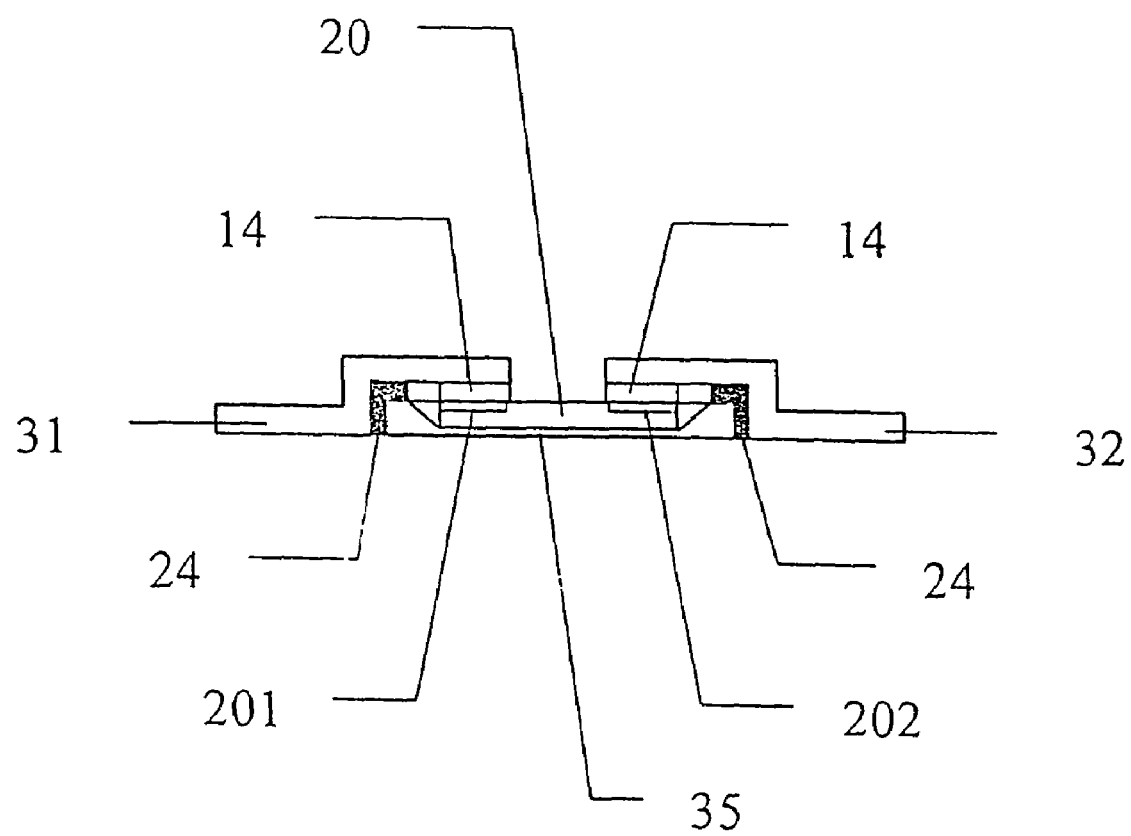
FIG. 9 shows a fourth embodiment of the present invention.
Figure 10:
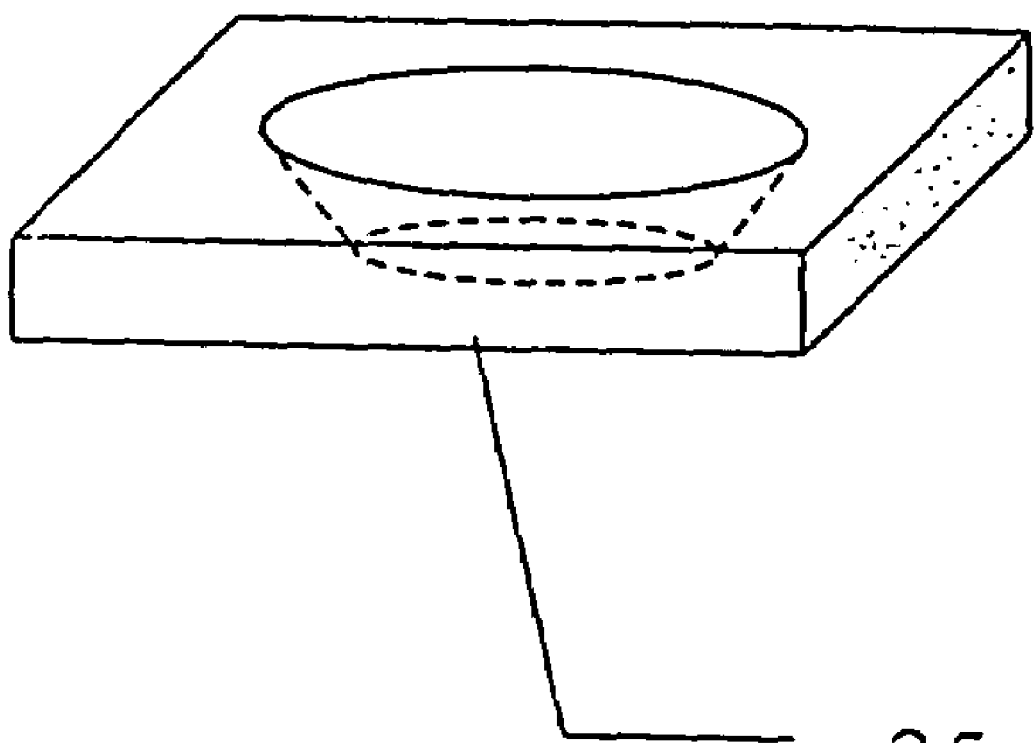
FIG. 10 shows the 3-dimensional view of the supporting frame in of FIG. 9.

FIG. 9 shows a fourth embodiment of the present invention for packaging a diode chip with two top electrodes 201 and 202. The diode chip is surrounded by a supporting frame 35. The top electrode 201 is connected to a zigzag metallic contact 31 for surface mounting through glue 14. The top electrode 202 is connected to a zigzag metallic contact for surface mounting through another solder 14. The supporting frame 35 is also attached to the metallic contact 31 by means of glue 24 and to the metallic contact 32 by means of another glue 24. The supporting frame 35 bridges across the two metallic contacts 31 and 32 and prevents any bending or twisting stress exerted on the diode chip 20. The shape of the supporting frame 35 is shown in FIG. 10 showing a conical window to anchor the diode chip.

Figure 11:
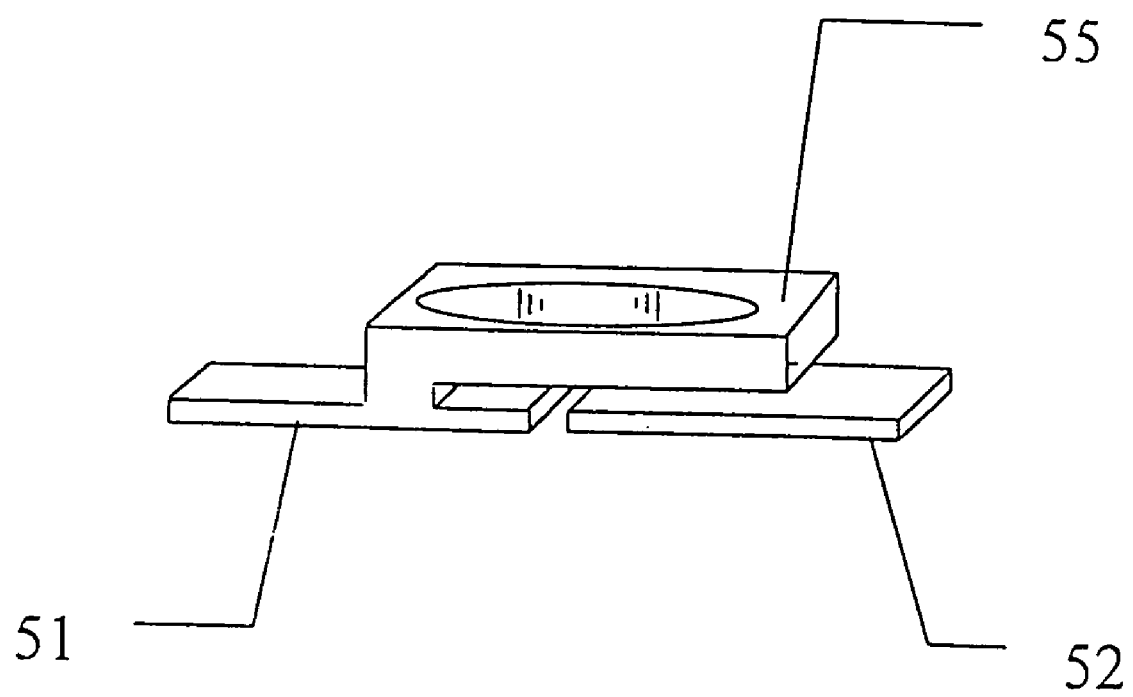
FIG. 11 shows a unitary structure of the supporting frame with one of the contacts.

FIG. 11 shows a fifth embodiment of the present invention. A supporting frame 55 is formed over a metallic contact 51 as a cantilever in a unitary structure. The end of the cantilever is glued (not shown) to the second metallic contact such that the supporting frame 55 is solidly fixed with respect to the two metallic contacts 51, 52. Thus the supporting frame 55 bridges across the two metallic contacts 51, 52 and prevents any bending or twisting stress exerted on the diode chip anchored inside the supporting frame 55.

Figure 12:
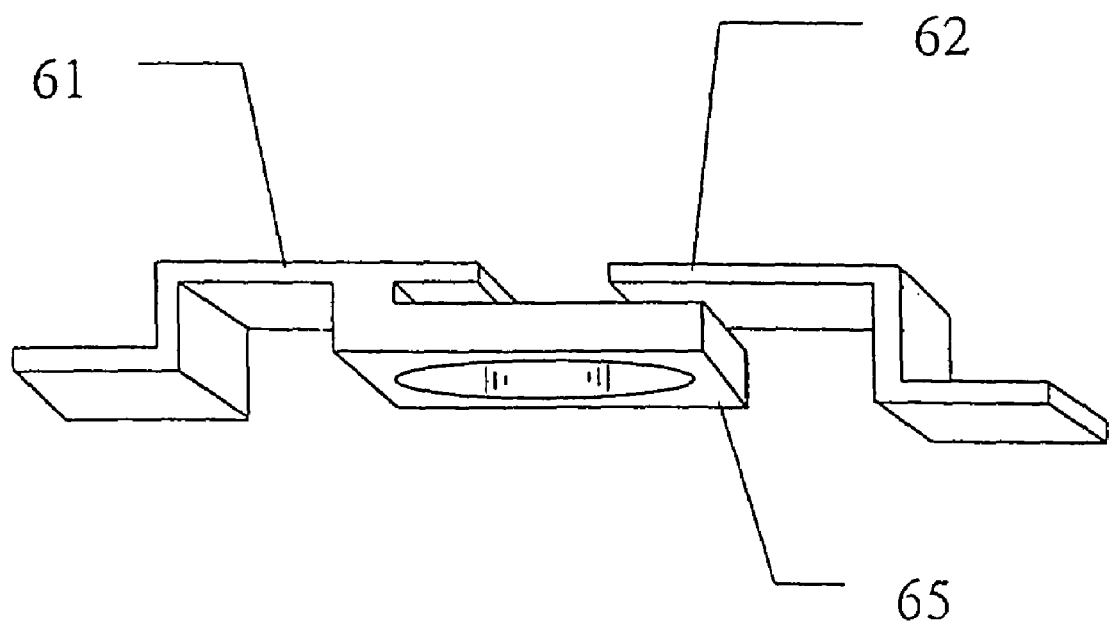
FIG. 12 shows a unitary structure of the supporting frame for the embodiment shown in FIG. 6.

FIG. 12 shows a sixth embodiment of the present invention. The metallic contacts 61 and 62 are of zigzag shape. The supporting frame 65 is hanging under the metallic contact 61. The free end of the cantilever is glued under the second metallic contact 62. Thus the supporting frame 65 is solidly fixed with respect to the two metallic contacts 61, 62 and prevents any bending or twisting stress exerted on the diode chip anchored inside the supporting frame 65.

Figure 13:
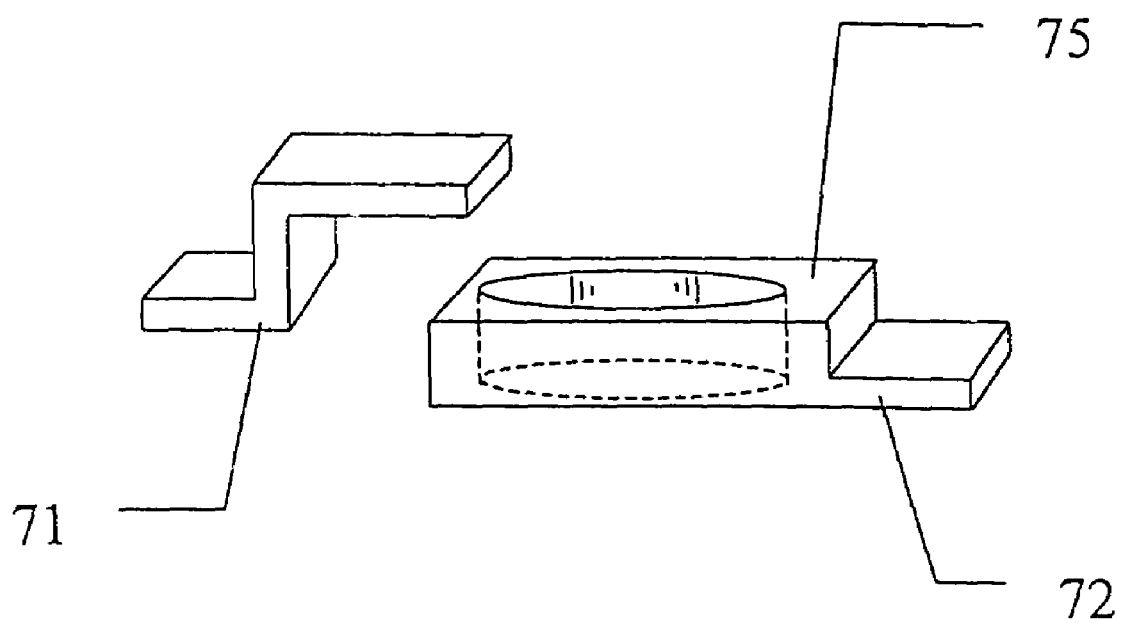
FIG. 13 shows a unitary structure of the supporting frame for the embodiment shown in FIG. 8.

FIG. 13 shows a seventh embodiment of the present invention. The supporting frame 75 is formed as a pedestal to the left of the metallic contact 72. The left end of the supporting frame 75 is glued under a zigzag metallic contact 71. Thus the supporting frame 75 is solidly fixed with respect to the two metallic contacts 71, 72 and prevents any bending or twisting stress exerted on the diode chip anchored inside a circular window of the supporting frame 75.

Figure 14:
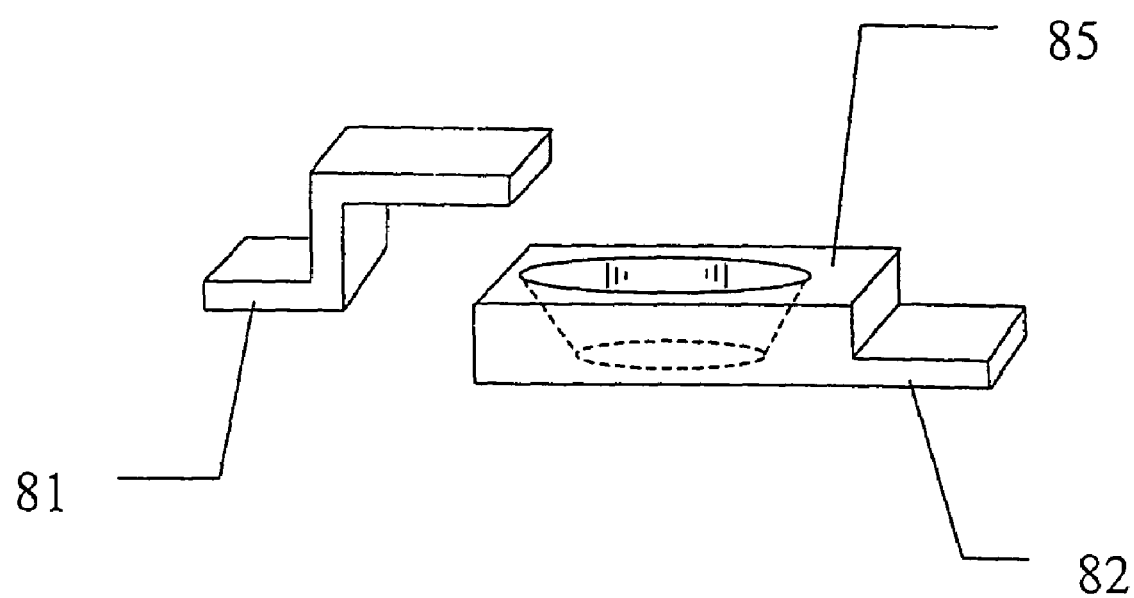
FIG. 14 shows a conical hole in the supporting frame shown in FIG. 13

FIG. 14 shows an eighth embodiment of the present invention. The structure is similar to that in shown in FIG. 13, except that the window of the supporting frame 85 is of conical shape. As in FIG. 13, the supporting frame forms a pedestal over the metallic contact 82 and is glued on top to another metallic contact 81.

While the preferred embodiments of the invention have been described, it will be apparent to those skilled in the art that various modifications may be made in the embodiments without departing from the spirit of the present invention. Such modifications are all within the scope of this invention.

The invention claimed is:

1. A surface mount diode package, comprising:
   diode chip having a first electrode and a second electrode on same surface;
   a first metallic contact coupled by soldering to said first electrode for surface mounting;
   a second metallic contact coupled by soldering to said second electrode and in line with said first metallic contact for surface mounting;
   a supporting frame surrounding said diode chip and solidly bridging between said first metallic contact and said second metallic contact to prevent bending of said diode chip, wherein
   both of said first metallic contact and said second metallic contact are of zigzag shape.

2. The surface mount diode package as claimed in claim 1, wherein the window of said supporting frame is of circular shape.

3. The surface mount diode package as described in claim 1, wherein the window of said supporting frame is of conical shape.

4. The surface mount diode package as described in claim 1, wherein said supporting frame is integrated with one of said metallic contact.

* * * * *